United States Patent
Haiut

(10) Patent No.: US 7,541,878 B2
(45) Date of Patent: Jun. 2, 2009

(54) TEMPERATURE COMPENSATED CRYSTAL OSCILLATOR

(75) Inventor: Moshe Haiut, Ramat-Gan (IL)

(73) Assignee: Intel Corporation, Santa Clara, CA (US)

( * ) Notice: Subject to any disclaimer, the term of this patent is extended or adjusted under 35 U.S.C. 154(b) by 565 days.

(21) Appl. No.: 11/323,822

(22) Filed: Dec. 29, 2005

(65) Prior Publication Data

US 2007/0155341 A1 Jul. 5, 2007

(51) Int. Cl.
*H03L 7/00* (2006.01)

(52) U.S. Cl. .................. 331/2; 331/158; 331/116 R; 331/116 FE; 331/18; 331/20

(58) Field of Classification Search ............... 331/158, 331/116 R, 116 FE, 2, 18, 20
See application file for complete search history.

(56) References Cited

U.S. PATENT DOCUMENTS 6,545,550 B1 * 4/2003 Frerking .................. 331/44
7,098,748 B2 * 8/2006 Schmidt .................. 331/176

* cited by examiner

*Primary Examiner*—Arnold Kinkead
(74) *Attorney, Agent, or Firm*—Blakely, Sokoloff, Taylor & Zafman LLP

(57) ABSTRACT

An apparatus, comprising: a first oscillator made from piezoelectric material to oscillate at a first frequency; a second oscillator to oscillate at a second frequency; a comparator to compare the first frequency to the second frequency; and a controller to change the first frequency in response to the comparing of the first frequency to the second frequency.

21 Claims, 8 Drawing Sheets

| Temp °C | Temp A/D | PPM1 | PPM2 | Ratio | VCO Reg. | VCO PPM |
|---|---|---|---|---|---|---|
| ... | ... | ... | ... | ... | ... | ... |
| -7 | -12 | -48.128 | 44.4416 | 793.5305 | 0 | -44.4416 |
| -6 | -12 | -45.167 | 44.8012 | 793.5284 | 64 | -44.8012 |
| -5 | -12 | -42.3 | 45 | 793.5263 | 128 | -45 |
| -4 | -4 | -39.527 | 45.0428 | 793.5241 | 192 | -45.0428 |
| -3 | -4 | -36.848 | 44.9344 | 793.5219 | 256 | -44.9344 |
| -2 | -4 | -34.263 | 44.6796 | 793.5197 | 320 | -44.6796 |
| -1 | -4 | -31.772 | 44.2832 | 793.5174 | 384 | -44.2832 |
| 0 | -4 | -29.375 | 43.75 | 793.5151 | 448 | -43.75 |
| 1 | -4 | -27.072 | 43.0848 | 793.5127 | 512 | -43.0848 |
| 2 | -4 | -24.863 | 42.2924 | 793.5103 | 576 | -42.2924 |
| 3 | -4 | -22.748 | 41.3776 | 793.5079 | 640 | -41.3776 |
| 4 | 4 | -20.727 | 40.3452 | 793.5055 | 704 | -40.3452 |
| 5 | 4 | -18.8 | 39.2 | 793.5031 | 768 | -39.2 |
| 6 | 4 | -16.967 | 37.9468 | 793.5006 | 832 | -37.9468 |
| 7 | 4 | -15.228 | 36.5904 | 793.4981 | 896 | -36.5904 |
| 8 | 4 | -13.583 | 35.1356 | 793.4957 | 960 | -35.1356 |
| 9 | 4 | -12.032 | 33.5872 | 793.4932 | 1024 | -33.5872 |
| 10 | 4 | -10.575 | 31.95 | 793.4908 | 1088 | -31.95 |
| 11 | 4 | -7.212 | 30.2288 | 793.4883 | 1152 | -30.2288 |
| 12 | 12 | -7.943 | 28.4284 | 793.4859 | 1216 | -28.4284 |
| 13 | 12 | -6.768 | 26.5536 | 793.4835 | 1280 | -26.5536 |
| 14 | 12 | -5.687 | 24.6092 | 793.4811 | 1344 | -24.6092 |
| 15 | 12 | -4.7 | 22.6 | 793.4787 | 1408 | -22.6 |
| 16 | 12 | -3.807 | 20.5308 | 793.4763 | 1472 | -20.5308 |
| 17 | 12 | -3.008 | 18.4064 | 793.474 | 1536 | -18.4064 |
| 18 | 12 | -2.303 | 16.2316 | 793.4717 | 1600 | -16.2316 |
| 19 | 12 | -1.692 | 14.0112 | 793.4695 | 1644 | -14.0112 |
| 20 | 20 | -1.175 | 11.75 | 793.4673 | 1728 | -11.75 |
| 21 | 20 | -0.752 | 9.4528 | 793.4651 | 1792 | -9.4528 |
| 22 | 20 | -0.423 | 7.1244 | 793.463 | 1856 | -7.1244 |
| 23 | 20 | -0.188 | 4.7696 | 793.461 | 1920 | -4.7696 |
| 24 | 20 | -0.047 | 2.3932 | 793.459 | 1984 | -2.3932 |
| 25 | 20 | 0 | 0 | 793.457 | 2048 | 0 |
| 26 | 20 | -0.047 | -2.4052 | 793.4552 | 2112 | 2.4052 |
| 27 | 20 | -0.188 | -4.8176 | 793.4534 | 2176 | 4.8176 |
| 28 | 28 | -0.423 | -7.2324 | 793.4516 | 2240 | 7.2324 |
| 29 | 28 | -0.752 | -9.6448 | 793.45 | 2304 | 9.6448 |
| 30 | 28 | -1.175 | -12.05 | 793.4484 | 2368 | 12.05 |
| ... | ... | ... | ... | ... | ... | ... |

FIG. 7

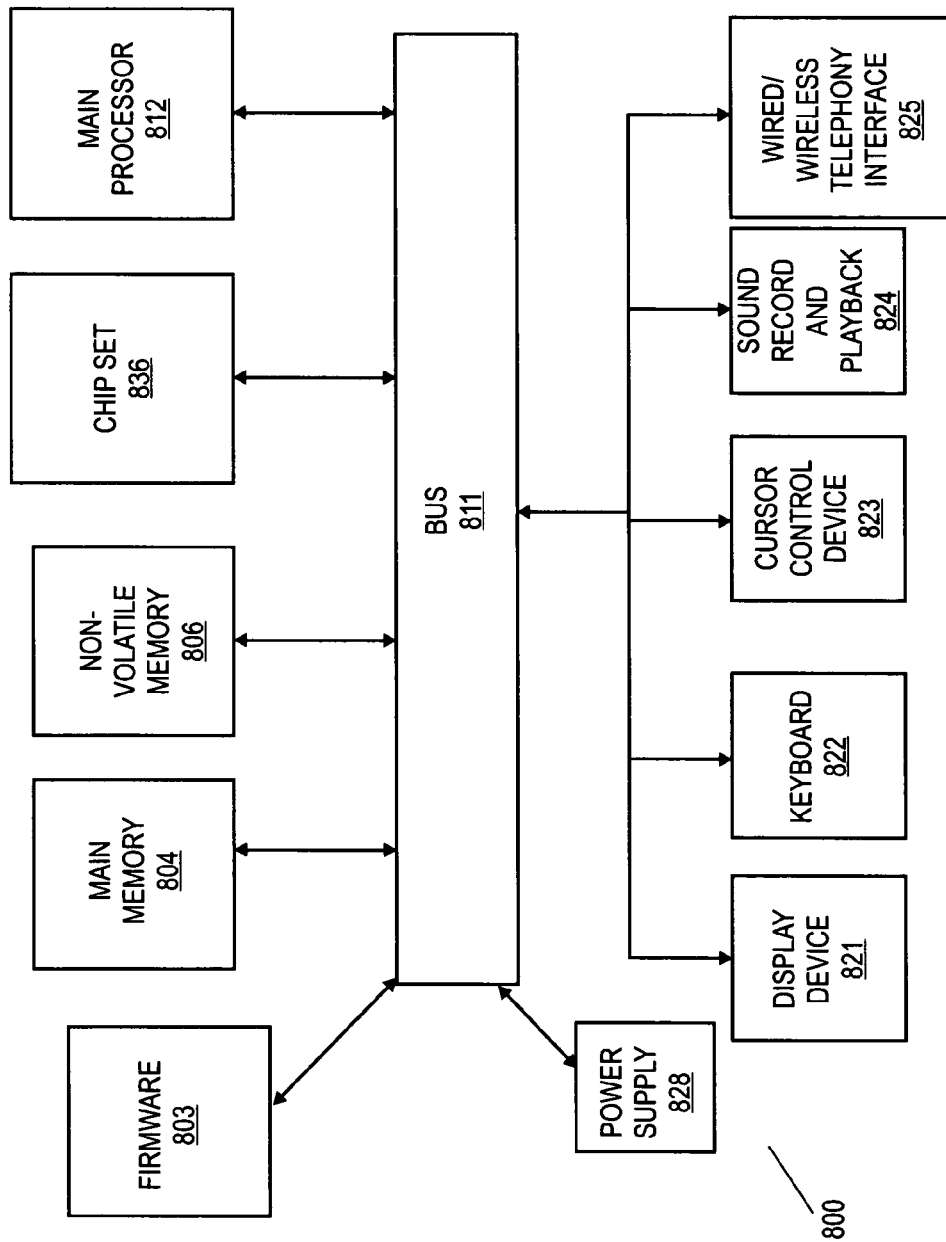

TEMPERATURE COMPENSATED CRYSTAL OSCILLATOR

BACKGROUND

1. Field

Embodiments of the invention relate generally to the field of oscillator circuits. More particularly, an embodiment of the invention relates to an improved architecture for a compensating crystal oscillator.

2. Description of the Related Art

Wireless portable technology has become a necessity in today's environment. Hence, many persons throughout the world own or use a cellular telephone and/or wireless device that needs to connect to a base transmitter station.

In connecting a wireless device or handset to a base station, the frequency of the connection signal of the handset or wireless device is synchronized to the broadcast signal of the base station. Therefore, the wireless device generates a frequency approximately equal to the frequency of the base station. To generate the frequency, a wireless device contains an oscillator.

Some oscillators currently used by wireless devices are Voltage Controlled Temperature Compensated Crystal Oscillators (VCTCXO). Crystals are good piezoelectric materials for creating an oscillator circuit, but because of temperature changes to the device, the material may create a frequency deviation in the oscillation. Therefore, the oscillator circuit is compensated for deviation from the desired frequency. Even though a simple crystal combined with oscillator circuitry is much cheaper than VCTCXO's, a simple crystal combined with oscillator circuitry alone is not accurate enough for wireless communications because of the frequency deviations. Hence, a VCTCXO may be used by most device manufacturers, such as, but not limited to, Motorola®, Ericsson®, Nokia®, and Audiovoxx®.

A VCTCXO is a pre-packaged component that compensates for frequency deviation due to temperature change such that a high level of accuracy needed for wireless communications can be achieved.

One problem with using a pre-packaged VCTCXO is that the component can be relatively expensive. Another problem with using a pre-packaged VCTCXO is that extra space in the wireless device is dedicated to the component. Because of the shrinking form factor of each generation of wireless device and the expanding quantity of production of wireless devices, a solution is needed in lowering the cost of production and minimizing the form factor of a wireless device.

BRIEF DESCRIPTION OF THE DRAWINGS

A better understanding of some embodiments of the present invention can be obtained from the following detailed description in conjunction with the following drawings, in which:

FIG. 7 is an example chart of frequency deviations per temperature measurement (FIG. 1) in accordance with one embodiment.

FIG. 8 is an example architecture of an electronic device incorporating an embodiment of the present invention in accordance with one embodiment.

DETAILED DESCRIPTION

Described below is a temperature compensated crystal oscillator based on crystal pair. Throughout the description, for the purposes of explanation, numerous specific details are set forth in order to provide a thorough understanding of embodiments of the present invention. It will be apparent, however, to one skilled in the art that embodiments of the present invention may be practiced without some of these specific details. In other instances, well-known structures and devices are shown in block diagram form to avoid obscuring the underlying principles of the present invention.

One embodiment of the present invention generates a desired frequency within a small range of deviation. Another embodiment of the invention is used in portable wireless devices (e.g., cellular telephones and handsets) to generate a frequency similar to a base station frequency in order to synchronize the device to the base station. The embodiment of the invention contains two oscillators whose generated frequencies may be compared in order to determine the frequency deviation of the oscillator generating the synchronization frequency. The embodiment also contains means for compensating the oscillator for frequency deviation to insure an accurate generated frequency.

Figure 1:
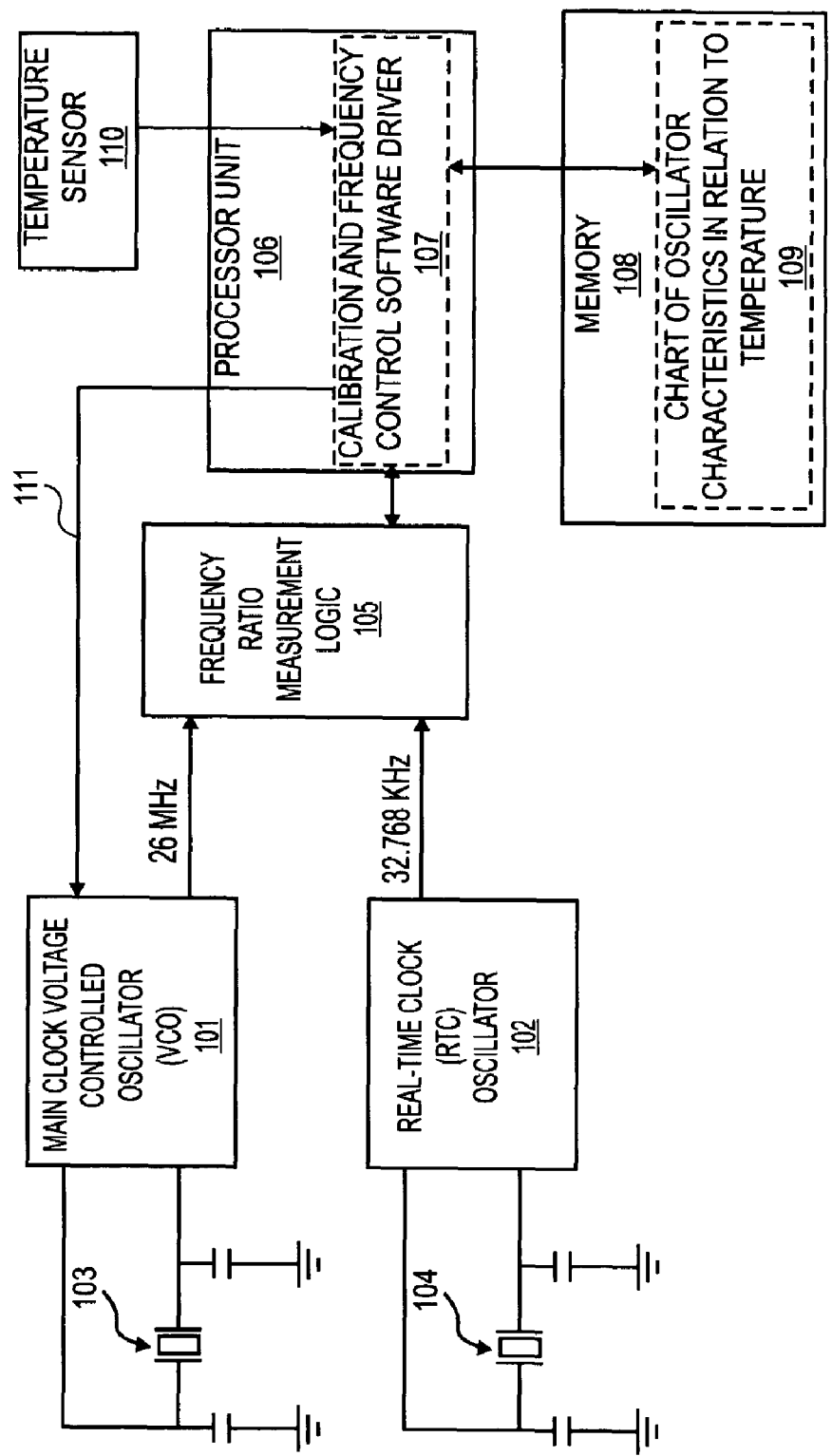
FIG. 1 is an example architecture of a voltage compensated signal generator using two oscillators for compensation of the frequency of the signal in accordance with one embodiment.

FIG. 1 is an example architecture of a voltage compensated signal generator using two oscillators for compensation of the frequency of the signal. The example architecture generally comprises: a Main Clock Voltage Controlled Oscillator circuit (VCO) 101, a crystal 103 connected to the VCO 101, a Real-Time Clock Oscillator circuit (RTC) 102, a crystal 104 connected to the RTC 102, a Frequency Ratio Measurement logic 105 for comparing the differences between the frequencies generated from VCO 101 and RTC 102, a processor 106 (e.g., a CPU), a calibration and frequency control software driver 107 executed by the processor 106 to determine the amount of compensation of the VCO 101, a data storage device 108 coupled to the processor 106, a chart of oscillator characteristics in relation to temperature 109 stored in data storage device 108 and accessed by processor 106 to determine the necessary compensation level for VCO 101, a temperature sensor 110 coupled to the processor 106 so that the processor 106 may choose a correct compensation voltage from multiple compensations extracted from the chart 109, and a feedback loop 111 so as to send a compensation voltage from the processor 106 to the VCO 101.

In the illustrated embodiment of FIG. 1, the VCO 101 is the oscillating means for generating a desired frequency within a small level of tolerance. VCO 101 is coupled to a piezoelectric material 103. Piezoelectric materials have a resonant frequency. When a voltage consisting of multiple components of differing frequencies is passed through a piezoelectric material 103, the piezoelectric material 103 will react to the component having the frequency equal to its resonant frequency and expand and contract at the rate of the resonant frequency. The VCO 101 amplifies the signal generated by the piezoelectric material 103 and feeds the amplified signal back through the piezoelectric material 103 in order to maintain the piezoelectric material creating a signal with a frequency equal to the resonant frequency of the piezoelectric material 103.

One piezoelectric material currently used for high precision frequency generators is a quartz crystal ("crystal"). Crystals are typically used because of their durability, relative cost effectiveness, and their higher precision as compared to other materials. For oscillators, many other piezoelectric materials exist (e.g., porcelain). Thus, the present invention should not be limited to using one specific type of piezoelectric material.

The resonant frequency of a piezoelectric material is largely determined by the shape of the material. For example, the way a crystal is cut and shaped will determine the resonant frequency of the crystal. For many telecommunication purposes, the desired frequencies can range from 800 Megahertz (MHz) to multiple Gigahertz (GHz). The oscillation frequency of the VCO 101 is shown to be 26 MHz. In one embodiment, the generated 26 MHz can be used to generate a frequency in the 800 MHz to multiple GHz range through use of a phase-locked loop (PLL). In alternate embodiments, the crystal 103 may be shaped to produce a variety of different frequencies needed for a specific application.

The VCO 101 may contain a register to store the compensation value to compensate the oscillation for any frequency deviation. The VCO 101 may also contain an open loop feedback circuit to use the compensation value stored in the register in compensating the oscillation for a frequency deviation.

Most wireless devices go through a large range of temperature variation. For example, elements of a device may emit enough heat to raise the temperature of the device. In addition, different localities may have severe differences in temperature from other localities around the world. Changes in temperature affect the resonant frequency of a crystal 103. The frequency deviation could be as much as plus or minus fifty parts per million (PPM). Therefore, VCO 101 is voltage compensated to correct for any deviation in frequency due to temperature change. The remainder of the description of the illustrated embodiment of FIG. 1 pertains to determining and applying the correct compensation voltage to the VCO 101.

While the VCO 101 is used to generate a signal of a certain frequency, the RTC 102 generates a signal at a frequency used by the device for real-time applications. For example, a device may need to determine the amount of time a user works in a specific application. Therefore, the frequency signal generated from the RTC 102 is used to calculate the time length.

In the illustrated embodiment, the RTC 102 and crystal 104 is similar to VCO 101 and crystal 103. The two major differences between the two oscillators is that the resonant frequency of crystal 104 (e.g., 32.768 Kilohertz (KHz)) is different than the resonant frequency of crystal 103 (e.g., 26 MHz) and VCO 101 can be adjusted through compensation. In alternative embodiments, the two oscillating means may have more or less differences such as, but not limited to, the materials 103 and 104 being different materials (e.g., crystal and porcelain), both oscillators 101 and 102 being adjusted through compensation, and VCO 101 and RTC 102 having significantly different architectures. In the illustrated embodiment, the temperature of the two oscillators is assumed to be the same.

The frequency ratio measurement logic 105 is a comparator coupled to the VCO 101 and RTC 102. The measurement logic 105 compares the signal frequency generated by the VCO 101 to the signal frequency generated by the RTC 102. The measurement logic 105 may be a logic circuit built into an existing integrated circuit (IC) of the device. For example, the logic may be built into an existing silicon chip with a minor increase in area. As a result, in one embodiment of the present invention, a separate hardware component is not needed for the frequency ratio measurement logic 105.

In an example embodiment, the ratio measurement logic 105 is a hardware logic block. The ratio measurement hardware logic 105 contains counters and registers that enable the software to calculate an accurate ratio of the frequencies of the two crystals (i.e., average number of cycles of the 26 MHz clock within a single cycle of the 32.768 KHz clock). The measurement of absolute frequencies cannot be performed without an accurate frequency as a reference (e.g., the base station signal frequency once the device is connected). Thus, the frequency ratio measurement logic 105 compares the ratio of the number of oscillations of one oscillator to the number of oscillations of the other oscillator. In one embodiment, the frequency ratio measurement logic 105 counts the average number of oscillations of the signal from VCO 101 per one oscillation of the signal from RTC 102. The measurements are performed periodically (e.g., every second) and each measurement lasts for a sufficient time to maintain an updated ratio that is accurate up to the granularity of parts of a PPM.

It will be understood by one skilled in the art that the frequency ratio measurement logic 105 may be implemented in a variety of alternate forms. For example, the measurement logic 105 may be a prepackaged component, an analog circuit, or a software code containing a group of instructions executed by a processor to compare the signals generated from the VCO 101 and the RTC 102.

The processor 106 determines compensation voltage needed by the VCO 101. The processor 106 may load the calibration and frequency control software driver 107 and then executes the instructions contained in the driver 107 to convert the result of the measurement logic 105 into a compensation voltage for changing the oscillation frequency of the VCO 101. While generating the compensation voltage, the processor 106 may query a chart of oscillator characteristics in relation to temperature 109 (stored in data storage device 108) to determine which compensation voltage level corresponds to which result from the measurement logic 105. In another embodiment, the processor 106 may use a temperature measurement from a temperature sensor 110 in order to pick the correct compensation voltage level if the query of the chart 109 returns multiple results.

In an example embodiment, the calibration and frequency control software driver 107 performs two main tasks: (1) it reads the measurement results from the hardware logic and calculates the exact ratio of the two frequencies and (2) it uses the calculated ratio and the crystals characteristics parameters that reside in the data storage device 108 to estimate the crystal temperature (as previously mentioned, it may be assumed the temperature is the same for both crystals). As each crystal has an individual curve of PPM deviation versus temperature the ratio between the two frequencies also varies as a function of temperature. The data storage device 108 may not store the full chart of PPM versus temperature of each crystal. It may instead store a few parameters. The data storage device 108 may not store the full chart because any given crystal type has known general frequency deviation equations and characteristics of the PPM function over temperature.

Once the temperature is predicted by the software driver, it may be used by the same driver to control the VCO 101 via the feedback loop 111. This is done by setting the control register of the VCO 101 to a value that is supposed to compensate for the frequency deviation that was caused by temperature. This compensation may be performed in an open loop, and hence an accurate result is not guaranteed, but the frequency tolerance over temperature can be reduced that way from ±50 PPM to a range much closer to that of a TCXO (Temperature Compensated Crystal Oscillator) element. The ratio measurement logic may take into consideration the existing value in the VCO 101 register when calculating the frequencies ratio.

In the long term, the calibration and frequency control software driver 107 may maintain and update the crystal parameters data in the chart 109 to compensate for frequency shifts and possible changes in temperature constants that happen due to aging of the two crystals. The software driver 107 may assume no deviation from nominal frequency when the portable wireless device is synchronized and locked on any base station. This way the driver 107 may calculate and digitally "calibrate" the VCO gain from time to time and store this calibration value in the chart 109 on the data storage device 108 among the other parameters of the two crystals.

The feedback loop 111 may couple the processor 106 to the VCO 101 so that the generated compensation voltage can be sent to the VCO 101 in order for the VCO 101 to adjust the frequency of its generated signal. The processor 106 may be digital logic. Therefore, the compensation voltage may pass through a digital-to-analog converter (DAC) along loop 111 in order for VCO 101 to understand the incoming compensation voltage.

A wireless device may contain the processor 106, memory 108, and temperature sensor 110. For example, a CPU, a flash memory, and a thermometer exist in the cellular telephone. Therefore, chart 109 could be stored in flash memory. The software driver 107 could be stored in flash memory (from where the CPU would load the driver), and the CPU could be communicably coupled to the VCO 101 to send the compensation voltage to the VCO 101.

It will be understood by one skilled in the art, though, that a multitude of alternate embodiments of the present invention exist. For example, the function of measurement logic 105 may be deduced to software and combined with driver 107. In addition, the processor 106 may be a central processor, a tertiary processor, a multiple processor unit, a dedicated circuit for generating a compensation voltage, or any other means for generating a compensation voltage. Furthermore, the memory may include, but is not limited to, flash memory, floppy diskettes, optical disks, Compact Disc Read-Only Memories (CD-ROMs), and magneto-optical disks, Read-Only Memories (ROMs), Random Access Memories (RAMs), Electrically Programmable Read-Only Memories (EPROMs), magnetic or optical cards, propagation media or other type of media/machine-readable medium suitable for storing electronic instructions and information. Therefore, the implementation of the present invention should not be limited to the illustrated embodiment of FIG. 1.

Figure 2:
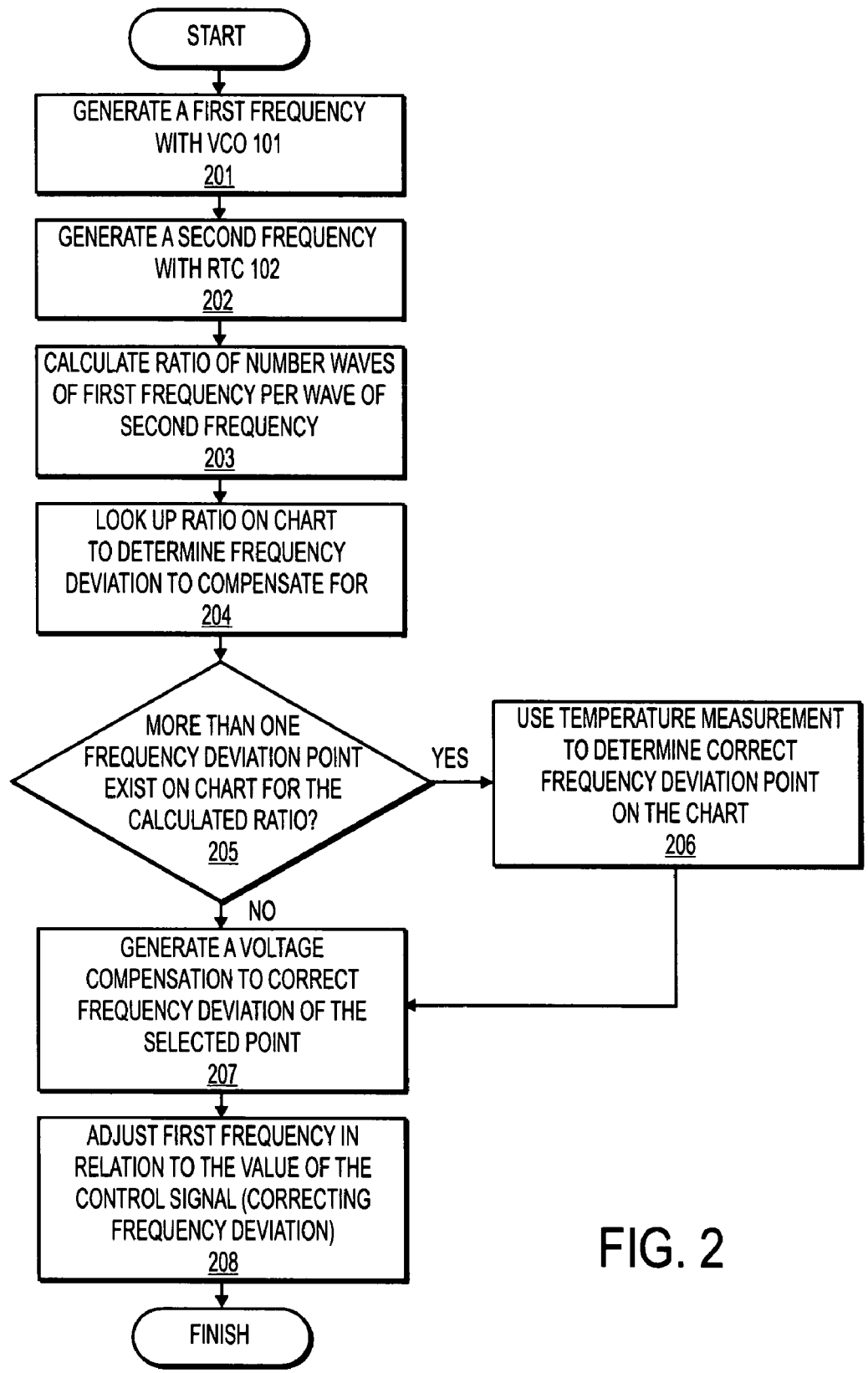
FIG. 2 is a flow-chart for compensating the main clock voltage controlled oscillator of FIG. 1 in accordance with one embodiment.

FIG. 2 illustrates the method used by the embodiment illustrated in FIG. 1 to adjust the frequency of the generated signal of VCO 101. Beginning in step 201, VCO 101 generates a signal with a first frequency. For illustration purposes, assume the VCO 101 is generating a signal at a frequency approximately 18.4 parts per million (PPM) greater than the desired frequency of 26 MHz, or 26.0004784 MHz.

Moving to step 202, RTC 102 generates a signal with a second frequency. In continuing the above illustration, assume RTC 102 is generating a signal at a frequency approximately 3 PPM less than the desired 32.768 KHz, or 32.767901696 KHz.

Once the two signals are generated, process flows to step 203, wherein the frequency ratio measurement logic 105 compares the two received signals generated by VCO 101 and RTC 102. In one embodiment of the present invention, the measurement logic 105 calculates the number of wavelengths of the signal generated by VCO 101 that equals one wavelength of the signal generated by RTC 102. In the current illustration of the present embodiment, the desired result would approximately be 793.457 first wavelengths per second wavelength (26M/32,768). The actual result with the assumed deviation would approximately be 793.474 first wavelengths per second wavelength (26.000478M/32.767901696).

An example architecture of the measurement logic 105 to perform the above example method may include a counter and other digital logic, but many methods and architectures to implement those methods are known to those skilled in the art. In addition to the above example method, alternative means of comparing the two frequencies may include, but are not limited to, calculating PPM deviation values from the desired frequencies for the two signals or calculating an estimated frequency for one signal by assuming the other signal deviation is zero. Thus, the scope of the present invention should not be limited to including a measurement logic 105 performing the above illustrated comparison.

Once the ratio is calculated by the measurement logic 105 in FIG. 1, process flows to step 204. In step 204, the processor 106 takes the result from the measurement logic 105, queries the memory 108 for the chart of oscillator characteristics in relation to temperature 109, and finds a compensation voltage corresponding to the result. FIG. 7 is an example embodiment of chart 109. Continuing the above-illustration for the present embodiment, the processing unit would find the ratio that most closely matched the result 793.474 calculated by measurement logic 105. The "Ratio" selection of row 704 in the chart of FIG. 7 shows the closest match. Having found a matching ratio, the processor 106 receives the compensation value (e.g., VCO PPM of FIG. 7) associated with the stored ratio on the chart 109. The chart 109 may contain register values that store the compensation value corresponding to the stored ratios. Thus, the processor 106 would retrieve, for example, a 13 bit value stored at bit location 1536 of memory (VCO Reg. column) once matching the result to the ratio of row 704.

The retrieving and/or calculating a compensation value can be performed in a variety of ways including, but not limited to, storing the compensation value directly in the chart 109 (e.g., VCO PPM) or calculating a compensation value every time compensation is required (thus not storing the value in a chart 109). Therefore, the present invention should not be limited to the present embodiment of using a chart to determine a compensation value.

In an alternative embodiment of the present invention, a curve regression may be performed on the ratio data points in respect to the compensation value (VCO PPM) of FIG. 7. Thus, in an attempt to generate a more precise compensation voltage, a compensation value between two stored compensation values can be calculated for a result that lies squarely between two ratios of the chart 109. Other than determining the closest stored ratio, alternative embodiments could use a first-order linear regression up to a curve regression of an order equal to the number of stored ratios. In addition, many other methods exist for approximating between two points, such as, but not limited to, a simple average or a weighted average. Thus, the present invention should not be limited to the illustrated embodiments of determining or calculating the compensation value.

Figure 3:
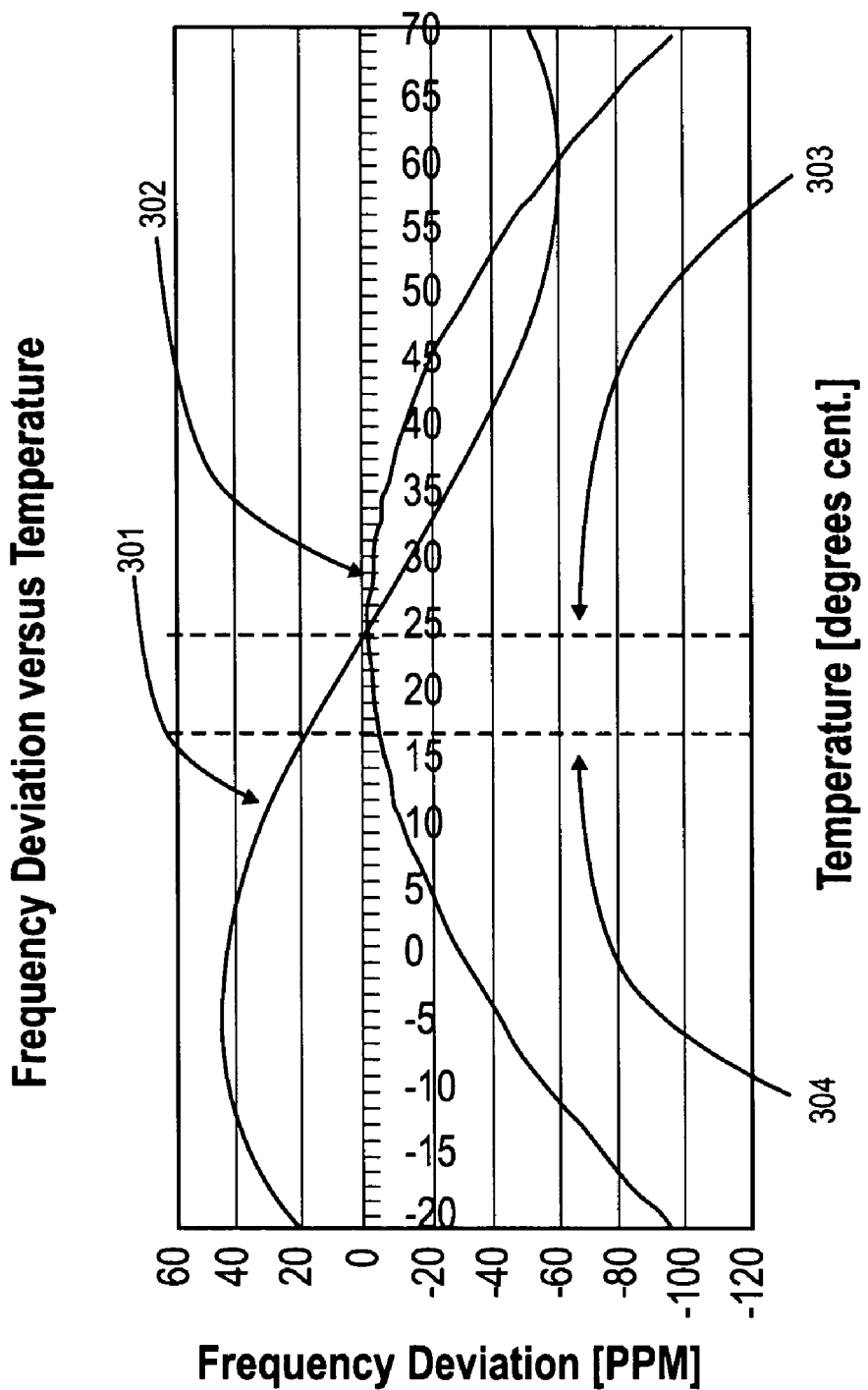
FIG. 3 is a Frequency Deviation versus Temperature graph for the two oscillators of FIG. 1 at different device temperatures in accordance with one embodiment.

The deviation in frequency of the two oscillators in relation to the temperature is approximately known. For example, other 26 MHz VCO's 101 typically exhibit the similar frequency deviations during temperature variations. Furthermore, VCO's 101 of the same frequency require similar compensation voltages for the same frequency deviation. Therefore, predetermined frequency deviation information and corresponding compensation values can be stored in a chart, like chart 109, for lookup during compensation of a particular VCO 101 in a device. For the present embodiment of oscillators with frequencies of 32.768 KHz and 26 MHz, FIG. 3 is an example graph of temperature versus frequency deviation for the 26 MHz frequency oscillation 301 and the 32.768 KHz frequency oscillation 302. The row 704 of FIG. 7 would approximately correspond to line 304 of FIG. 3, wherein the frequency deviations (intersection of line 304 and curves 301 and 302 in FIG. 3) can be estimated for the two oscillations. The temperature can also be estimated for the two oscillations with the specific frequency deviations (approximately 17 degrees Celsius or 62.6 degrees Fahrenheit for line 304).

Figure 4:
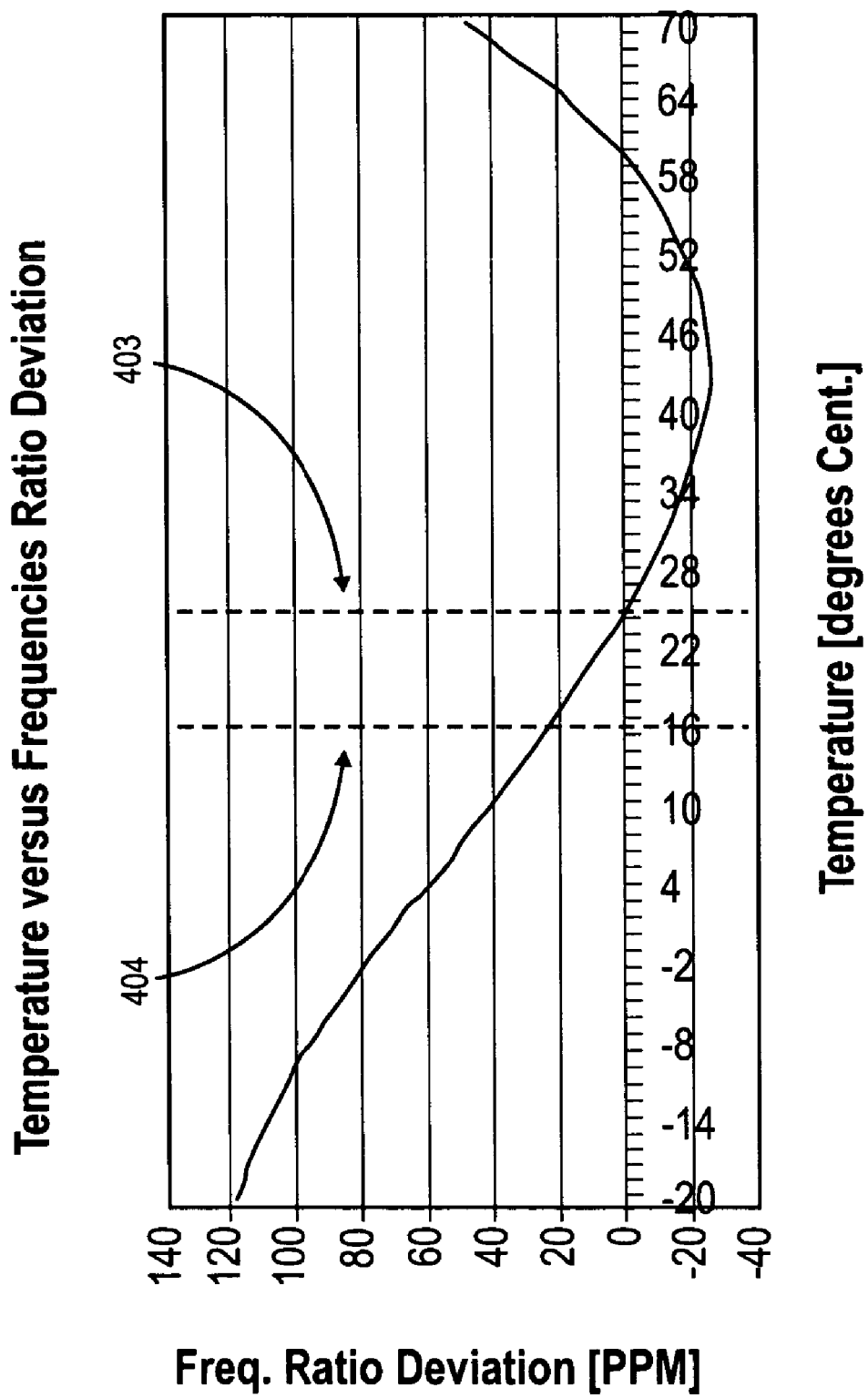
FIG. 4 is a Temperature versus Frequencies Ratio Deviation Graph wherein the differences between the Frequency Deviations of the two curves of FIG. 3 are compared in accordance with one embodiment.
Figure 5:
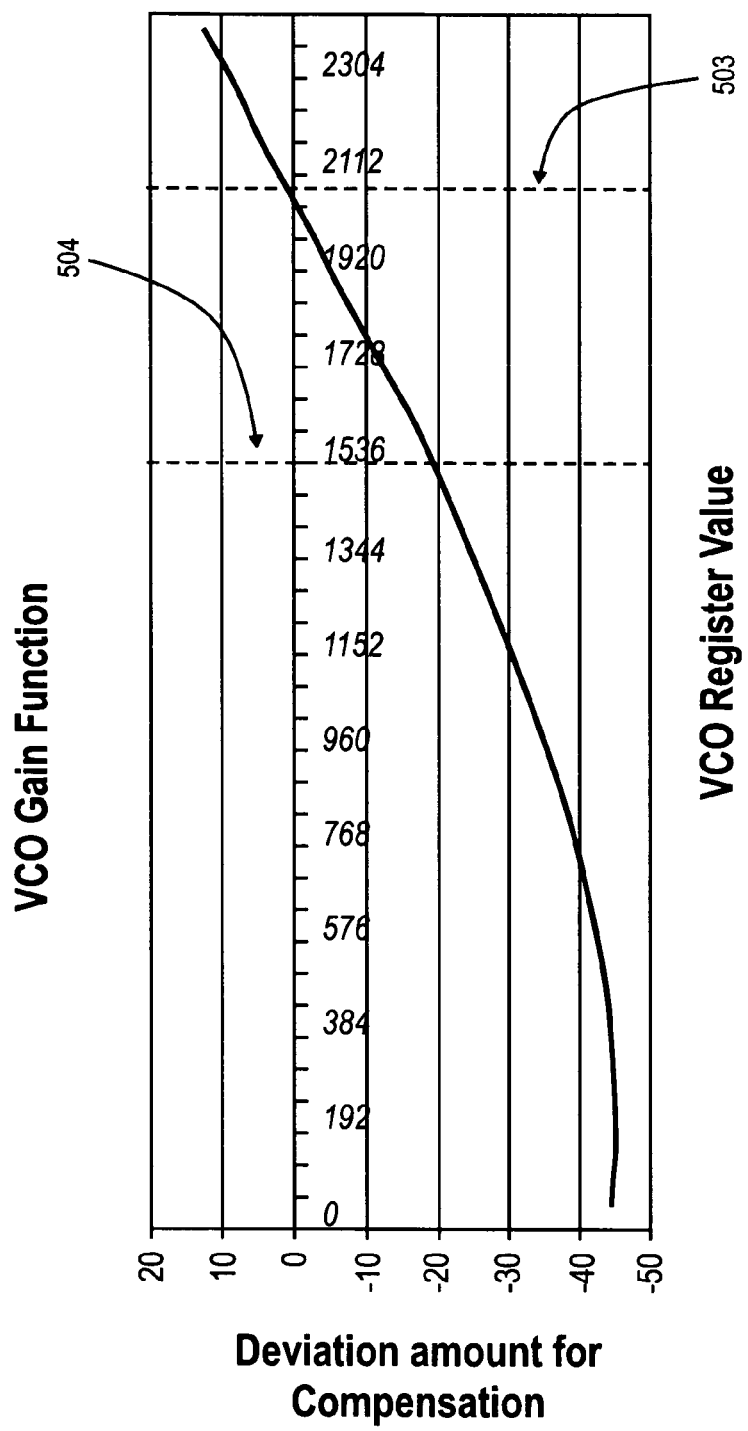
FIG. 5 is a VCO gain function graph of the frequency deviation the main clock voltage controlled oscillator of FIG. 1 needs to be compensated in accordance with one embodiment.

FIG. 4 is a graph of the combined frequency deviations illustrated in FIG. 3. For example, line 404 shows the difference between the two frequency deviation curves at line 304 of FIG. 3. The difference shown is approximately 21.4 PPM at 17 degrees Celsius (62.6 degrees Fahrenheit). Shown in both FIG. 3 and FIG. 4, 25 degrees Celsius (77 degrees Fahrenheit) is an approximate temperature where both oscillations contain no frequency deviation, as highlighted by lines 303 and 403. This point on the graph correlates to row 703 of the chart 109 illustrated in FIG. 7. At this point, no compensation is necessary. Therefore, as can be seen in an example graph of compensation values in FIG. 5, line 503 (corresponding to lines 303 and 403 and row 703) shows that a compensation value of zero is stored for the temperature when no deviation exists. In addition, line 504 shows that for a ratio of 795.1567 (row 704 of FIG. 7), VCO 101 needs to be compensated for an approximate 18.4 PPM frequency deviation.

The chart 109 may be updated in the device's future when the deviation characteristics in relation to temperature change over time. For example, aging of the crystal 103 may cause VCO 101 to exhibit more frequency deviation for temperature variations. Therefore, the life of the device may be expanded through chart updates during the device's lifespan. The VCO 101 may also be adjusted using variable capacitors or no adjustment may be performed. Thus, the present invention should not be limited to any disclosed embodiment for maintenance of correct compensation of the oscillator.

Referring to FIGS. 3 and 4, multiple device temperatures may exist where the ratio is approximately the same for the temperature point in the chart 109 illustrated in FIG. 7. For example, in FIGS. 3 and 4, the ratio at 25 degrees Celsius (where the VCO frequency deviation curve crosses the RTC frequency deviation curve at 0 PPM frequency deviation) is approximately equal the ratio at 60 degrees Celsius (where the VCO frequency deviation curve crosses the RTC frequency deviation curve at approximately −57 PPM frequency deviation). Therefore, in querying the chart 109, the processor 106 may receive multiple compensation values corresponding to differing temperatures but similar ratios to the result of the measurement logic 105.

Referring back to FIG. 2, process flows to decision block 205 to determine whether multiple frequency deviations exist in chart 109 for the result of measurement logic 105. If multiple values (e.g., ratios) exist, then process flows to step 206, where the processor 106 of the present embodiment uses a temperature measurement from the temperature sensor 110 to determine the correct value for compensation from the chart 109. As illustrated in FIGS. 3 and 4, multiple values returned in step 204 of FIG. 2 correspond to temperatures far away from each other. For example, the same ratio exists for 25 degrees Celsius and approximately 60 degrees Celsius. Therefore, the processor 106 would use a temperature measurement of 25 degrees Celsius to choose the ratio corresponding to the temperature of 25 degrees Celsius.

As previously stated, a temperature sensor exists in most wireless devices. Therefore, a preexisting temperature sensor may be used for the present embodiment. The existing temperature sensor may have significant error, such as plus or minus 5 degrees Celsius, because the sensor may only take crude measurements or error may occur in converting the analog measurement to a digital signal. For example, the Temp A/D column of the chart of FIG. 7 illustrates that a temperature measurement after analog to digital conversion may be 12 degrees Celsius for an actual device temperature of 12 degrees Celsius to 19 degrees Celsius. The present embodiment, though, does not need accurate temperature measurements because the temperatures of competing compensations can differ by 35 degrees Celsius.

It will be understood by one skilled in the art that alternative embodiments of determining a correct value from the chart in the present invention exist, such as, but not limited to, minimizing the temperature range stored in the chart 109 so that similar ratios will not exist for different temperatures. Therefore, the present invention should not be limited to any specific embodiment.

Referring back to FIG. 2, once step 206 is completed or decision block 205 is answered in the negative, a compensation value is generated by the processor 106 from the retrieved value of chart 109. In one embodiment of the present invention, the compensation value is read from the chart 109. In an alternative embodiment, the processor 106 calculates a compensation value from a different value received from the chart 109. For example, the processor 106 may calculate a compensation value after retrieving a VCO PPM value from row 704 of the chart 109 that shows a compensation value needs to create a −18.4 PPM correction in the signal generated by VCO 101. Thus, many embodiments of a means for calculating a compensation value exist, and the present invention should not be limited to any specific list of embodiments.

Figure 6:
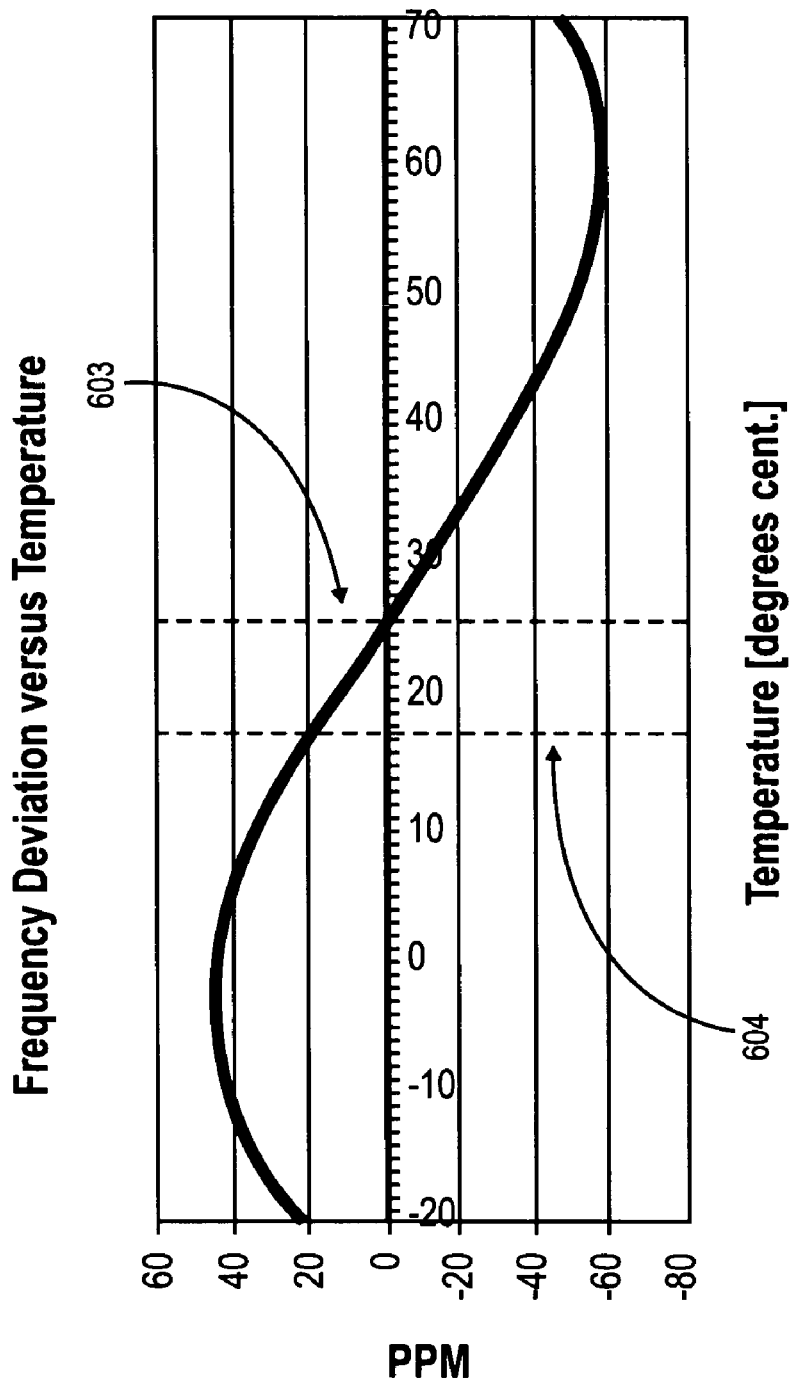
FIG. 6 is a graph of the original frequency deviation curve and the desired compensated frequency deviation curve versus temperature in accordance with one embodiment.

After the compensation value is generated by the processor 106, process of FIG. 2 moves to step 208, wherein the VCO 101 receives the compensation value and adjusts the frequency of its generated oscillation. After adjusting the frequency, the frequency deviation should almost be eliminated, and the flow-chart of FIG. 2 is exited. FIG. 6 illustrates what the frequency deviation versus temperature graph of the VCO 101 generated oscillation may be before and after frequency adjustment of step 208 in the present embodiment. Line 603 corresponds to lines 303 and 403 and row 703 of FIGS. 3, 4, and 7. Line 604 corresponds to lines 304 and 404 and row 704. In the above illustration, line 604 illustrates that the frequency deviation would hopefully be changed from approximately 18.4 PPM to 0 PPM after step 208.

One embodiment of VCO 101 that would adjust the oscillation frequency upon receiving a compensation value is the VCO 101 using a variable capacitor with a control input of the compensation value. Changing the capacitance in a simple oscillation circuit will change the frequency of the oscillation. Multiple alternative embodiments of VCO 101 also exist where the oscillation frequency may be adjusted. Therefore, the present invention should not be limited to the use of a variable capacitor.

Examples of mobile devices may be a laptop computer, a cell phone, a personal digital assistant, or other similar device with on board processing power and wireless communications ability that is powered by a battery.

FIG. 8 illustrates a block diagram of an example portable device that may use an embodiment of the temperature compensated crystal oscillator. In one embodiment, computer system 800 comprises a communication mechanism or bus 811 for communicating information, and an integrated circuit component such as a main processing unit 812 coupled with bus 811 for processing information. One or more of the components or devices in the computer system 800 such as the main processing unit 812 or a chip set 836 may use an embodiment of the temperature compensated crystal oscillator. The main processing unit 812 may consist of one or more processor cores working together as a unit.

Computer system 800 further comprises a random access memory (RAM) or other dynamic storage device 804 (referred to as main memory) coupled to bus 811 for storing information and instructions to be executed by main processing unit 812. Main memory 804 also may be used for storing temporary variables or other intermediate information during execution of instructions by main processing unit 812.

Firmware 803 may be a combination of software and hardware, such as Electronically Programmable Read-Only Memory (EPROM) that has the operations for the routine recorded on the EPROM. The firmware 803 may embed foundation code, basic input/output system code (BIOS), or other similar code. The firmware 803 may make it possible for the computer system 800 to boot itself.

Computer system 800 also comprises a read-only memory (ROM) and/or other static storage device 806 coupled to bus 811 for storing static information and instructions for main processing unit 812. The static storage device 806 may store OS level and application level software. The static storage device 806 may be an embedded flash memory.

Computer system 800 may further comprise a display 821, such as a cathode ray tube (CRT) or liquid crystal display (LCD), coupled to bus 811 for displaying information to a computer user. A chipset may interface with the display device 821.

An alphanumeric input device (keyboard) 822, including alphanumeric and other keys, may also be embedded in the device 800 and coupled to bus 811 for communicating information and command selections to main processing unit 812. An additional user input device is cursor control device 823, such as a trackball, trackpad, stylus, or cursor direction keys, include in the device 800 and coupled to bus 811 for communicating direction information and command selections to main processing unit 812, and for controlling cursor movement on a display 821. A chipset may interface with the input output devices.

A sound recording and playback device 824, such as a speaker and/or microphone, may optionally be included in the device 800 and coupled to bus 811 for audio interfacing with computer system 800. Another device that may be coupled to bus 811 is a wireless communication module 825. The wireless communication module 825 may employ a Wireless Application Protocol to establish a wireless communication channel. The wireless communication module 825 may implement a wireless networking standard such as Institute of Electrical and Electronics Engineers (IEEE) 802.11 standard, IEEE std. 802.11-1999, published by IEEE in 1999.

In one embodiment, the software used to facilitate the routine can be embedded onto a machine-readable medium. A machine-readable medium includes any mechanism that provides (i.e., stores and/or transmits) information in a form accessible by a machine (e.g., a computer, network device, personal digital assistant, manufacturing tool, any device with a set of one or more processors, etc.). For example, a machine-readable medium includes recordable/non-recordable media (e.g., read only memory (ROM) including firmware; random access memory (RAM); magnetic disk storage media; optical storage media; flash memory devices; etc.), as well as electrical, optical, acoustical or other form of propagated signals (e.g., carrier waves, infrared signals, digital signals, etc.); etc.

Embodiments of the invention may include various steps as set forth above. At least some of the steps may be embodied in machine-executable instructions which cause a general-purpose or special-purpose processor to perform certain steps. In addition, other steps may be performed by specific hardware components that contain hardwired logic for performing the steps, or by any combination of programmed computer components and custom hardware components.

Throughout the foregoing description, for the purposes of explanation, numerous specific details were set forth in order to provide a thorough understanding of the invention. It will be apparent, however, to one skilled in the art that the invention may be practiced without some of these specific details. Accordingly, the scope and spirit of the invention should be judged in terms of the claims which follow.

What is claimed is:

1. An apparatus, comprising:
   a first oscillator made from piezoelectric material to oscillate at a first frequency for wireless communications;
   a second oscillator to oscillate at a second frequency;
   a comparator to compare the first frequency to the second frequency;
   a controller to change the first frequency in response to the comparing of the first frequency to the second frequency;
   a processor to execute an algorithm to generate a compensation value based upon comparing the first frequency to the second frequency;
   a feedback loop to communicably couple the first oscillator to the processor, the feedback loop to carry the compensation value from the processor to the first oscillator, wherein the first frequency is changed in response to generating the compensation value;
   a register communicably coupled to the feedback loop, the register to store the compensation value; and
   an open-loop feedback circuit communicably coupled to the piezoelectric material and the register to deliver the compensation value from the register to the piezoelectric material.

2. The apparatus of claim 1, wherein the algorithm is implemented in a software driver executed by the processor.

3. The apparatus of claim 1, wherein the algorithm is implemented using digital logic.

4. The apparatus of claim 1, wherein the comparator generates a ratio of the first frequency divided by the second frequency.

5. The apparatus of claim 1, wherein the controller further comprises a data storage device communicably coupled to the processor, the data storage device to store a plurality of ratios of a first frequency of the first oscillator compared to a second frequency of the second oscillator at a plurality of temperatures, wherein a ratio of the first frequency to the second frequency is a second input to the algorithm.

6. The apparatus of claim 5, wherein the controller further comprises a temperature sensor communicably coupled to the processor to provide a third input to the algorithm.

7. The apparatus of claim 1, wherein the second oscillator is a Real-Time clock oscillator.

8. The apparatus of claim 1, wherein the first oscillator comprises a variable capacitor to adjust the first frequency based upon the compensation value.

9. The apparatus of claim 2, wherein the processor is a Central Processing Unit.

10. The apparatus of claim 5, wherein the algorithm is to calibrate the plurality of ratios of a first frequency of the first oscillator compared to a second frequency of the second oscillator at a plurality of temperatures.

11. The apparatus of claim 5, wherein the data storage device is a flash memory.

12. The apparatus of claim 2, wherein the software driver is to calibrate generating the compensation value.

13. The apparatus of claim 1, wherein the first oscillator and the second oscillator are within the same device.

14. A system, comprising:
a first oscillator made from piezoelectric material to oscillate at a first frequency for wireless communications;
a second oscillator to oscillate at a second frequency;
a comparator communicably coupled to the first oscillator and the second oscillator, the comparator to compare the first frequency to the second frequency to create a comparison and to calculate a result based on the comparison;
a processor communicably coupled to the comparator and the first oscillator to execute an algorithm, the algorithm to generate a compensation value to send to the first oscillator upon receiving the result from the comparator; and
a data storage device communicably coupled to the processor, the data storage device to store a plurality of ratios of a first frequency of the first oscillator compared to a second frequency of the second oscillator at a plurality of temperatures, wherein a ratio of the first frequency to the second frequency is a second input to the algorithm, wherein the result is an input of the algorithm and further wherein the first oscillator will change the first frequency upon receiving the compensation value.

15. The system of claim 14, wherein the system is a mobile device having a wireless communication module communicably coupled to the first oscillator and a battery to power the system.

16. The system of claim 14, wherein the first oscillator and the second oscillator are within the same device.

17. A method, comprising:
generating a first frequency for wireless communications by a first oscillator made from piezoelectric material;
generating a second frequency by a second oscillator;
comparing the first frequency to the second frequency;
generating a compensation value in response to comparing the first frequency to the second frequency;
sending the compensation value to the first oscillator;
changing the first frequency based upon the first oscillator receiving the compensation value; and
measuring a temperature with a temperature sensor, wherein the temperature measurement is used in generating the compensation value,
wherein the compensation value is generated by an algorithm, wherein inputs of the algorithm are a value from a table of frequencies of the first oscillator and frequencies of the second oscillator at varying temperatures, the temperature measurement, and the comparison of the first frequency to the second frequency.

18. The method of claim 17, wherein the comparison is a number generated by dividing the first frequency by the second frequency and the table includes a set of numbers equal to frequencies of the first oscillator divided by the frequencies of the second oscillator at varying temperatures and a set of temperature values correlated to the set of numbers.

19. A machine-readable medium storing executable instructions, which when executed by the machine, to cause the machine to perform the following operations, comprising:
receiving a comparison value, wherein the comparison value is derived from comparing a first frequency for wireless communications by a first oscillator made from piezoelectric material to a second frequency by a second oscillator;
retrieving a first frequency compensation value derived from a known relationship between the first oscillator and the second oscillator,
wherein the retrieved first frequency compensation value is based upon the comparison value; and sending a voltage compensation to the first oscillator to change the first frequency based upon retrieving the first frequency compensation value, and
wherein the compensation value is generated by an algorithm, wherein inputs of the algorithm are a value from a table of frequencies of the first oscillator and frequencies of the second oscillator at varying temperatures, the temperature measurement, and the comparison of the first frequency to the second frequency.

20. The article of manufacture of claim 19, wherein the voltage compensation is based upon the first frequency compensation value and a previous voltage compensation sent to the first oscillator.

21. The article of manufacture of claim 19, further comprising:
retrieving a second frequency compensation value derived from the known relationship between the first oscillator and the second oscillator, wherein the second frequency compensation value is based upon the comparison value;
receiving a temperature measurement, wherein the temperature measurement is generated based upon measuring a temperature proximate to at least one of the oscillators;
selecting either the first frequency compensation value or the second frequency compensation value based upon the temperature measurement; and
generating the voltage compensation based upon the selected frequency compensation value.

* * * * *